United States Patent [19]

Isobe et al.

[11] Patent Number: 4,950,926
[45] Date of Patent: Aug. 21, 1990

[54] CONTROL SIGNAL OUTPUT CIRCUIT

[75] Inventors: Mitsuo Isobe; Shinich Nakauchida, both of Kanagawa, Japan

[73] Assignee: Kabushiki Kaisha Toshiba, Kanagawa, Japan

[21] Appl. No.: 261,066

[22] Filed: Oct. 24, 1988

[30] Foreign Application Priority Data

Oct. 30, 1987 [JP] Japan ............................. 62-275471

[51] Int. Cl.⁵ .................. H03K 19/20; H03K 17/687; G11C 7/02
[52] U.S. Cl. .................................... 307/451; 307/443; 307/445; 307/448; 307/571; 307/585; 365/208
[58] Field of Search ............... 307/451, 443, 445, 448, 307/241, 242, 244, 571, 576, 579, 585; 365/208

[56] References Cited

U.S. PATENT DOCUMENTS

| | | | |
|---|---|---|---|
| 3,862,440 | 1/1975 | Suzuki et al. | 307/451 |
| 4,084,105 | 4/1978 | Teranishi et al. | 307/241 |
| 4,757,214 | 7/1988 | Kobayashi | 307/448 |
| 4,788,454 | 11/1988 | Tanagawa et al. | 307/448 |

FOREIGN PATENT DOCUMENTS 0037462  3/1979  Japan .................................. 307/451

Primary Examiner—Stanley D. Miller
Assistant Examiner—Trong Quang Phan
Attorney, Agent, or Firm—Finnegan, Henderson, Farabow, Garrett, and Dunner

[57] ABSTRACT

A control signal output circuit for outputting a control signal in response to first and second input signals and a power source voltage, comprises an inverter which inverts one of the first and second input signals and outputs an inverted signal. The control signal output circuit further comprises a logic circuit which outputs a control signal in response to the inverted signal and the other of the first and second input signals. A switch is further provided to disconnect the inverter from the power source voltage in response to the other of the first and second input signals.

12 Claims, 2 Drawing Sheets

CONTROL SIGNAL OUTPUT CIRCUIT

BACKGROUND OF THE INVENTION

1. Field of the Invention

This invention concerns a control signal output circuit for a semiconductor device, and more particularly a control signal output circuit for a semiconductor memory circuit.

2. Description of the Prior Art

Conventionally, positive and negative logic control signals are used to increase the degree of freedom of control when producing a control signal for a semiconductor device, such as a semiconductor memory device.

FIG. 1 shows a block diagram of a semiconductor memory device in which positive and negative logic control signals CE1, CE2 are used to produce a chip control signal CE.

In this device, when the signal is low level and the CE2 signal is high level, the internal components of the chip are activated and the semiconductor memory device performs its normal operation. Namely, an address signal A is input to an address input circuit 2, and a corresponding memory cell in a memory cell array 4 is selected in accordance with the address signal supplied via a row decoder 3 and a column decoder 5 (including a sense amplifier circuit and a write circuit).

In the read operation, a read/write control signal R/W is supplied via a read/write control circuit 6 to control a data input/output circuit 7 so as to output a data from an I/O terminal.

In the write operation, the R/W signal controls the data input/output circuit 7 and a write circuit (included in block 5) to write data input to the input output terminal I/O into a corresponding memory cell in the memory cell array 4 in accordance with an address signal from the address input circuit 2.

FIG. 2 shows a circuit diagram of a conventional chip control circuit 1 in FIG. 1. The control circuit of FIG. 2 includes an inverter circuit 11 and a NOR circuit 12. A positive logic control signal CE2 is inverted by the inverter circuit 11 and supplied to the NOR circuit 12. The NOR circuit 12 produces a chip control signal CE in response to the output signal of the inverter 11 and a negative logic control signal CE1.

FIG. 3 shows a circuit diagram of another conventional chip control circuit. The circuit of FIG. 3 includes an inverter circuit 13, a NAND circuit 14 and an inverter circuit 15. A negative logic control signal CE1 is inverted by the inverter circuit 13 and supplied to the NAND circuit 14. The NAND circuit 14 and the inverter circuit 15 produces a chip control signal CE in response to the output signal of the inverter 13 and a positive logic control signal CE2.

In these circuits, the chip control circuit 1 produces a high level CE signal only when the negative logic control signal CE1 is low level and the positive logic control signal CE2 is high level, and the internal components of the chip are activated to perform the prescribed normal operation. When the negative logic control signal CE1 is high level or the positive logic control signal CE2 is low level, the chip control signal CE changes to low level, and the internal components of the semiconductor memory are changed into a disabled state. In this way, using the positive and the negative logic control signals to produce a control signal, the degree of freedom of the semiconductor device is increased as the disabled state of the semiconductor device is achieved by controlling one of the positive and the negative logic signals In the disabled state, the semiconductor device assumes a stand-by state and a reduction of the power consumption is achieved. Particularly when complementary MOS (CMOS) circuits are used, the consumption current can be reduced to a leak current. For example the leak is only about several µAs in the case of a 64K bit CMOS static RAM.

However in the conventional circuit of FIG. 2, a relatively large current flows through the inverter circuit 11 according to the level of the CE2 signal. Namely, in the case where a CMOS type inverter circuit is used for the inverter circuit 11, a relatively large current flows through the inverter circuit when the CE2 signal changes. Especially, in the case where the CE2 signal is at an intermediate level, a kind of DC current of several mA flows. The amount of this current can be as large as about 1000 times the magnitude of the leak current.

In the case where an N channel type MOS transistor having a load is used for the inverter circuit 11, a relatively large current flows through the inverter when the CE2 signal is high level.

Thus, the total power consumption, including these currents, increases even if the CE signal is low to achieve the stand-by state for reducing the power consumption.

In the conventional circuit of FIG. 3, a relatively large current also flows through the inverter 13.

To prevent this current from flowing through the inverters 11 and 13, it is necessary to make the CE2 signal low level in the circuit of FIG. 2, and to make the CE1 signal high level to achieve a CE signal of low level and produce the stand-by state. This is a restriction of the system, and the merit of using the two signals CE1 and CE2 is lost.

SUMMARY OF THE INVENTION

Therefore, an object of this invention is to reduce the power consumption of the semiconductor device without restricting the degree of freedom of using the two control signals CE1 and CE2.

To achieve the above object, this invention provides a control signal output circuit for outputting a control signal in response to first and second input signals and a power source voltage, comprising: inverter means responsive to the power source voltage for inverting one of the first and second input signals and outputting an inverted signal; logic circuit means for outputting a control signal in response to the inverted signal and the other of the first and second input signals; and switching means for disconnecting the inverter means from the power source voltage in response to the other of the first and second input signals.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings.

DETAILED DESCRIPTION OF THE INVENTION

Figure 1:
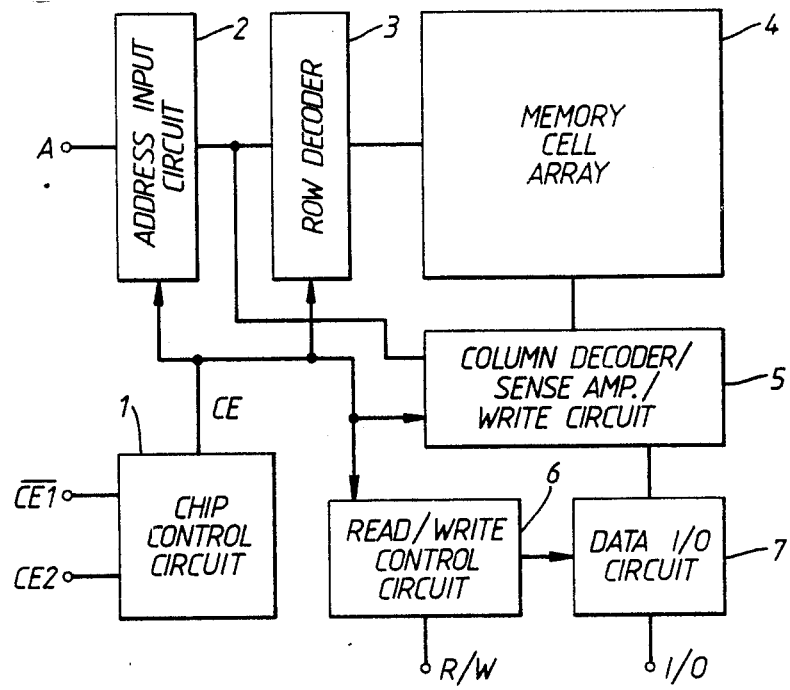
FIG. 1 is a block diagram of semiconductor memory device.
Figure 2:
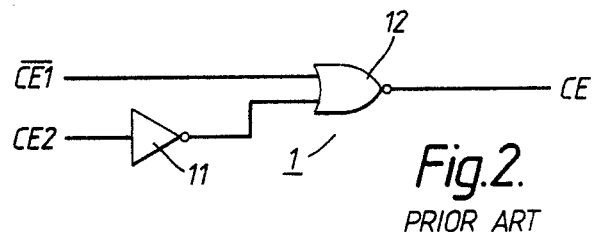
FIG. 2 is a circuit diagram of a conventional control circuit.
Figure 3:
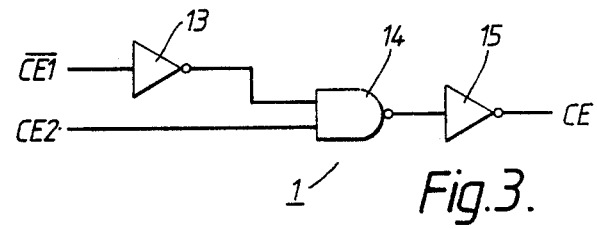
FIG. 3 is a circuit diagram of another conventional control circuit.
Figure 4:
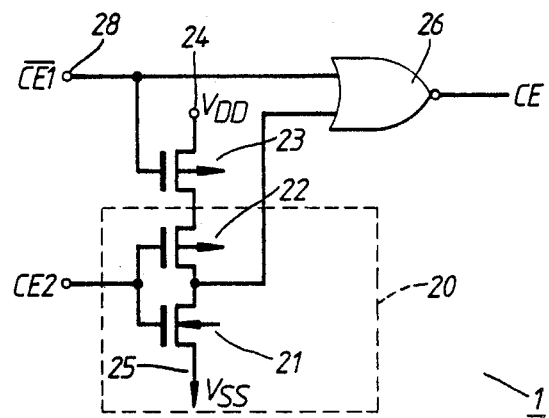
FIG. 4 is a circuit diagram of a preferred embodiment of this invention.

Referring now to FIG. 4, there is illustrated a circuit diagram of an embodiment of this invention.

In the preferred embodiment of FIG. 4, a terminal 28 receives a negative logic control signal CE1 as a first signal, and a terminal 29 receives a positive logic control signal CE2 as a second signal.

In the present invention, there is provided inverter means for inverting one of the first and second signals, for outputting an inverted signal in response to a power source voltage. In the preferred embodiment of FIG. 4, the inverter means is an inverter circuit 20. The inverter circuit 20 is a CMOS type, and includes an N channel type MOS transistor 21 and a P channel type MOS transistor 22. A source electrode of the transistor 21 is connected to a terminal 25 which is supplied with a reference voltage VSS. A drain electrode of the transistor 21 is connected to a drain electrode of the transistor 22. Gate electrodes of the transistors 21 and 22 are connected to the terminal 29, and receive the second signal CE2.

In the present invention, there is provided logic circuit means 26 for outputting a control signal CE in response to the inverted signal of the second signal CE2 and the first signal CE1. In the preferred embodiment of FIG. 4, the logic circuit means is a NOR circuit 26 which receives the first signal CE1 and the output signal of the inverter circuit 20.

In the present invention, there is provided switching means 23 for disconnecting the inverter means from the power source in response to the first signal CE1. In the preferred embodiment of FIG. 4, the switching means is a P type MOS transistor 23. The gate electrode of the transistor 23 is connected to the terminal 28, and the drain electrode thereof is connected to the source electrode of the transistor 22. The source electrode of the transistor 23 is connected to a terminal 24 which is supplied with a power source voltage VDD.

In the embodiment of FIG. 4, the condition to get a control signal CE of high level is that the first signal CE1 is low level and the second signal CE2 is high level. Namely, when the first signal CE1 is low level, the transistor 23 is in a conductive state, and the inverter 20 inverts the second signal CE2 to low level. Thus, the both signals supplied to the NOR circuit 26 are low level, and the control signal CE changes to high level.

To get a control signal CE of low level, it is necessary to make one of the CE1 signal and the output signal of the inverter circuit 20 high level.

When the first signal CE1 is high level, this means that one of the input signals to the NOR control 25 is high level. Thus, the output signal CE of the NOR circuit 26 is low level, and the semiconductor device (not shown) supplied with the signal CE changes into a disabled state.

It should be noted that when the first signal CE1 is high level, the MOS transistor 23 changes into a non-conductive state. Thus, the inverter circuit 20 is disconnected from the power source terminal 24. Therefore, in spite of the level of the second signal CE2, no current flows through the inverter 20. Thus, the power consumption of the semiconductor device is reduced to the level of a leak current only.

Next, the operation when the second signal CE2 is low level is as follows. In this condition, when the first signal CE1 is low level, the transistor 23 changes into conductive state, and the inverter circuit 20 inverts the second signal CE2 to supply a high level signal to the NOR circuit 26. In this state, as at least one of the input signals to the NOR Circuit 26 is high level, the output signal CE of the NOR circuit 26 changes into low level. When the first signal CE1 changes into high level, the control signal CE changes to low level, as previously explained.

It should be noted that when the second signal CE2 is low level, the MOS transistor 21 is in a non-conductive state. Thus, no current flows through the inverter circuit 20 in spite of the conductive state of the transistor 22. As a result, when the second signal CE2 is low level, the standby state of the semiconductor memory device is achieved in spite of the first signal CE1.

In this way, when the first signal CE1 is set to high level or the second signal CE2 is set low level to achieve the stand-by state, the current which flows through the inverter circuit 20 is prevented in spite of the level of the remaining CE2 or CE1 signal. Thus, the power consumption in the stand-by state of the device can be reduced to the level of only a leak current.

Figure 5:
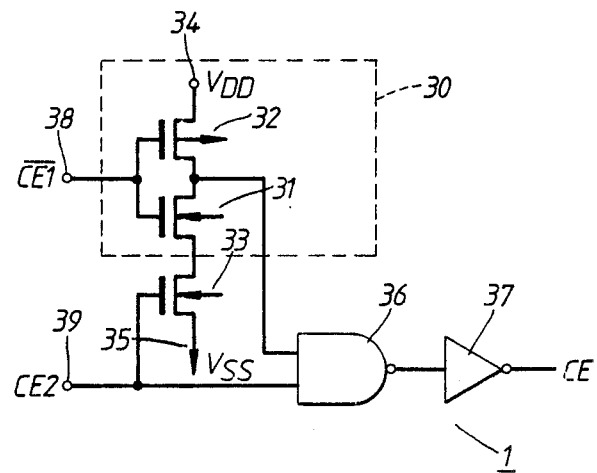
FIG. 5 is a circuit diagram of another embodiment of this invention.

FIG. 5 is a circuit diagram of another embodiment of this invention. In this embodiment, a terminal 38 receives a negative logic control signal CE1 as a first signal, and a terminal 39 receives a positive logic control signal CE2 as a second signal.

An inverter circuit 30 is provided to output an inverted output signal of the first signal CE1. The inverter circuit 30 includes an N type MOS transistor 31 and a P type MOS transistor 32. The source electrode of the transistor 32 is connected to a terminal 34 being supplied with a power source voltage VDD. The drain electrodes of the transistors 31 and 32 are connected in common.

An N type MOS transistor 33 is provided as a switching means for disconnecting the inverter circuit 30 from a power source voltage VSS. The gate electrode of the transistor 33 is connected to the terminal 39 to receive the second signal CE2, and the drain electrode thereof is connected to the source electrode of the transistor 31. The source electrode of the transistor 33 is connected to the terminal 35 which is supplied with a reference voltage VSS.

A NAND circuit 36 and an inverter circuit 37 are provided to output a control signal CE in response to the output signal of the inverter circuit 30 and the second signal CE2.

In this circuit, it is necessary to set the first signal CE1 at low level and the second signal CE2 at high level to obtain a control signal CE of high level to enable the semiconductor memory device (not shown). Namely, when the second signal CE2 is at high level, the MOS transistor 33 is in a conductive state. Thus, the inverter circuit 30 is operative and outputs a high level output signal by inverting the first signal CE1 of low level. In this state, both of the inputs to the NAND circuit 36 are high level. Thus, the inverter circuit 37 outputs a control signal CE of high level by inverting the output of the NAND circuit 36. In this state, the semiconductor memory device is changed to an enabled state.

To obtain a control signal CE of low level and change to the disabled state of the memory device, it is necessary to change the first signal CE1 to high level or to change the second signal CE2 to low level.

When the second signal CE2 is low level, this means that one of the input signals to the NAND circuit 36 is low level. Thus, a control signal CE of low level is achieved by inverting the output of the NAND circuit 36. In this condition, the semiconductor memory device is changed to the disabled state. It should be noted that the MOS transistor 33 is nonconductive, since the second signal CE2 is low level. Thus, no current flows through the inverter 30, as the inverter 30 is disconnected from the power source voltage, namely from the terminal 35 which is supplied with the reference voltage VSS, in spite of the level of the first signal CE1. Thus, a reduction of the power consumption is achieved.

Next, the operation when the first signal CE1 is at high level is as follows. In this condition, when the second signal CE2 is at high level, the transistor 33 is in a conductive state, and the inverter 30 inverts the first signal CE1 to supply a low level signal to the NAND circuit 36. In this state, one of the input signals to the NAND circuit 36 is low level. Thus, the control signal CE changes to low level, and the semiconductor device changes into a disabled state. When the first signal CE1 is high level, the MOS transistor 32 is in a non-conductive state. Thus, no current flows through the inverter circuit 30, in spite of the level of the second signal CE2.

When the second signal CE2 changes into low level, the control signal CE changes into low level, and the disabled state of the semiconductor device is achieved, as previously explained.

In this way, when the first signal CE1 is set to high level or the second signal CE2 is set to low level to achieve the stand-by state, the current which flows in the inverter circuit 30 is prevented in spite of any level of the other signal CE2 or CE1. Therefore, a reduction of the power consumption is achieved without restricting the degree of freedom using the two signals CE1 and CE2.

The present invention is applicable not only to semiconductor memory devices but also to any semiconductor device which is supplied with the two signals to produce a control signal. Needless to say, this invention is applicable in the case where an NMOS transistor having a load is used as an inverter circuit means.

The present invention has been described with respect to a specific embodiment. However, other embodiments based on the principles of the present invention should be obvious to those of ordinary skill in the art. Such embodiments are intended to be covered by the claims.

What is claimed is:

1. A control signal output circuit for outputting a control signal for controlling a semiconductor device in response to first and second input signals and a power source voltage, the control signal having a first level for activating the semiconductor device and a second level for placing the semiconductor device in a stand-by state, comprising:
    inverter means responsive to the power source voltage for inverting the first input signal and outputting an inverted signal;
    logic circuit means for outputting a control signal in response to both the inverted signal and the second input signal; and
    switching means for disconnecting the inverter means from the power source voltage in response to the second input signal during the stand-by state of the semiconductor device.

2. The control signal output circuit according to claim 1, wherein the inverter means includes a CMOS circuit.

3. The control circuit according to claim 1, wherein the first signal is a negative logic signal, the second signal is a positive logic signal and the switching means includes a PMOS transistor.

4. The control signal output circuit of claim 1, wherein the first signal is a positive logic signal, the second signal is a negative logic signal and the switching means includes an NMOS transistor.

5. The control signal output circuit according to claim 3, wherein the logic circuit means includes a NOR circuit.

6. The control signal output circuit according to claim 4, wherein the logic circuit means includes a NAND circuit and an inverter circuit.

7. A logic circuit for outputting an output signal having a first level and a second level in response to first and second input signals and a power source voltage, comprising:
    inverting means for inverting the first input signal to obtain an inverted signal, said inverting mans including an inverter circuit supplied with the first input signal, and switching means for controllably connecting the inverter circuit to the power source voltage in response to the second of the first and second input signals while the output signal is at the first level; and
    logic circuit means for outputting the output signal in response to the inverted signal and the second input signal.

8. The logic circuit of claim 7, wherein the inverting means includes a CMOS circuit.

9. The logic circuit of claim 8, wherein the switching means include a P type MOS transistor having a gate electrode supplied with the other input signal.

10. The logic circuit of claim 8, wherein the switching means includes an N type MOS transistor having a gate electrode supplied with the other input signal.

11. The logic circuit of claim 9, wherein the logic circuit means includes a NOR circuit.

12. The logic circuit of claim 10, wherein the logic circuit means includes a NAND circuit and a second inverter circuit.

* * * * *